(12) United States Patent
Notsu et al.

(10) Patent No.: US 11,043,465 B2
(45) Date of Patent: Jun. 22, 2021

(54) SEMICONDUCTOR DEVICE

(71) Applicant: SUMITOMO ELECTRIC INDUSTRIES, LTD., Osaka (JP)

(72) Inventors: Hiroshi Notsu, Ibaraki (JP); Hisato Michikoshi, Ibaraki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/608,345

(22) PCT Filed: Dec. 12, 2017

(86) PCT No.: PCT/JP2017/044514
§ 371 (c)(1),
(2) Date: Oct. 25, 2019

(87) PCT Pub. No.: WO2018/207396
PCT Pub. Date: Nov. 15, 2018

(65) Prior Publication Data
US 2020/0365546 A1 Nov. 19, 2020

(30) Foreign Application Priority Data
May 11, 2017 (JP) .............................. JP2017-094358

(51) Int. Cl.
*H01L 23/49* (2006.01)
*H01L 29/16* (2006.01)
(Continued)

(52) U.S. Cl.
CPC .......... *H01L 24/29* (2013.01); *H01L 23/4924* (2013.01); *H01L 29/1608* (2013.01);
(Continued)

(58) Field of Classification Search
CPC . H01L 24/29; H01L 23/4924; H01L 29/1608; H01L 2224/29111;
(Continued)

(56) References Cited

U.S. PATENT DOCUMENTS

| 6,689,684 | B1* | 2/2004 | You | ................... | H01L 21/76804 |
| | | | | | 257/E21.577 |
| 2002/0109152 | A1* | 8/2002 | Kobayashi | .......... | H01L 23/3735 |
| | | | | | 257/177 |

(Continued)

FOREIGN PATENT DOCUMENTS

| JP | 2005-129886 | 5/2005 |
| JP | 2015-008242 | 1/2015 |

(Continued)

*Primary Examiner* — Sheikh Maruf
(74) *Attorney, Agent, or Firm* — IPUSA, PLLC

(57) ABSTRACT

A semiconductor device includes a semiconductor chip made of material containing silicon carbide, a base plate including a plate-shaped insulating body and metal layers disposed on opposite faces thereof, and a bonding material bonding the semiconductor chip on one face of the base plate, wherein the bonding material is made of a metal material whose post-bonding melting point is greater than or equal to 773° C., wherein a thickness of the bonding material is less than or equal to 50 micrometers, wherein a thickness of the base plate is greater than or equal to 500 micrometers, and wherein with a thickness of the insulating body being denoted as $t_I$, and a thickness of each of the metal layers being denoted as $t_M$, a value of $t_I/t_M$ is greater than or equal to 4.3.

18 Claims, 8 Drawing Sheets

(51) Int. Cl.
*H01L 23/00* (2006.01)
*H01L 23/492* (2006.01)

(52) U.S. Cl.
CPC ............... *H01L 2224/29111* (2013.01); *H01L 2224/29139* (2013.01); *H01L 2224/29147* (2013.01); *H01L 2224/29155* (2013.01)

(58) Field of Classification Search
CPC . H01L 2224/29139; H01L 2224/29147; H01L 2224/29155; H01L 23/49811; H01L 2224/73265; H01L 24/73; H01L 24/92; H01L 24/49; H01L 24/48; H01L 23/3735; H01L 24/32; H01L 24/83
USPC .......................................................... 257/77
See application file for complete search history.

(56) References Cited

U.S. PATENT DOCUMENTS

| | | | | |
|---|---|---|---|---|
| 2002/0157247 | A1* | 10/2002 | Li | H05K 3/3463 29/840 |
| 2003/0232494 | A1* | 12/2003 | Adams | H01L 21/76819 438/622 |
| 2004/0056349 | A1* | 3/2004 | Yamada | H01L 23/49562 257/724 |
| 2005/0047101 | A1* | 3/2005 | Osanai | H01L 21/4871 361/760 |
| 2005/0258484 | A1* | 11/2005 | Itou | H01L 24/05 257/341 |
| 2007/0160858 | A1* | 7/2007 | Fukuda | H01L 23/3735 428/469 |
| 2007/0175025 | A1* | 8/2007 | Tsukamoto | H05K 3/4652 29/832 |
| 2008/0079021 | A1* | 4/2008 | Bayerer | H01L 23/3735 257/177 |
| 2009/0056996 | A1* | 3/2009 | Kato | H01L 24/83 174/260 |
| 2009/0101392 | A1* | 4/2009 | Kaga | H05K 1/0271 174/252 |
| 2009/0278233 | A1* | 11/2009 | Pinnington | H01L 21/02389 257/615 |
| 2009/0283309 | A1* | 11/2009 | Naba | B23K 35/0244 174/258 |
| 2011/0067906 | A1* | 3/2011 | Kuromitsu | H01L 23/3735 174/255 |
| 2011/0074010 | A1* | 3/2011 | Kuromitsu | H01L 23/498 257/703 |
| 2011/0075451 | A1* | 3/2011 | Bayerer | H01L 24/06 363/37 |
| 2012/0168209 | A1* | 7/2012 | Kato | H01L 23/15 174/255 |
| 2014/0291699 | A1* | 10/2014 | Yano | H01L 23/3735 257/77 |
| 2015/0108510 | A1* | 4/2015 | Urano | H01L 33/62 257/88 |
| 2018/0182728 | A1* | 6/2018 | Michikoshi | H01L 23/3675 |

FOREIGN PATENT DOCUMENTS

| | | | |
|---|---|---|---|
| JP | 2015008242 A * | 1/2015 | ............. H01L 24/37 |
| JP | 2016-174165 | 9/2016 | |
| WO | 2017/006916 | 1/2017 | |

* cited by examiner

SEMICONDUCTOR DEVICE

TECHNICAL FIELD

The disclosures herein relate to a semiconductor device.

The present application claims priority to Japanese patent application No. 2017-094358 filed on May 11, 2017, and the entire contents of this Japanese patent application are hereby incorporated by reference.

BACKGROUND ART

In order to electrically couple the surface electrodes of a semiconductor chip to a circuit pattern on the surface of an insulating substrate via a copper plate, the surface electrodes of a semiconductor chip and the copper plate may be bonded together through a solder bonding layer having a thickness of 100 micrometers or more in some structures of semiconductor devices which are known in the art (see Patent Document 1, for example). In this type of semiconductor device, strain and thermal stress occurring in the solder bonding layer due to a difference in the linear expansion coefficient between the semiconductor chip and the copper plate may be reduced, which improves the reliability of bonding between the semiconductor chip and the copper plate.

RELATED-ART DOCUMENTS

Patent Document

[Patent Document 1] Japanese Patent Application Publication No. 2005-129886

SUMMARY OF THE INVENTION

According to one aspect of a present embodiment, a semiconductor chip made of material containing silicon carbide, a base plate including a plate-shaped insulating body and metal layers disposed on opposite faces thereof, and a bonding material bonding a semiconductor chip on one face of the base plate are provided. The bonding material is made of a metal material whose post-bonding melting point is greater than or equal to 773° C. The thickness of the bonding material is less than or equal to 50 micrometers. The thickness of the base plate is greater than or equal to 500 micrometers. With a thickness of the insulating body being denoted as $t_I$, and a thickness of each of the metal layers being denoted as $t_M$, a value of $t_I/t_M$ is greater than or equal to 4.3.

MODE FOR CARRYING OUT THE INVENTION

Figure 1:
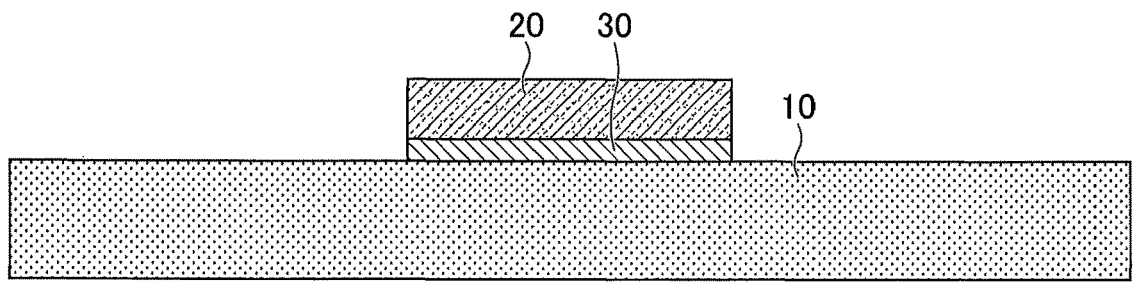
FIG. 1 is a model diagram of a semiconductor device used for evaluating the film thickness of a bonding layer.

Problem to be Solved by the Present Disclosure

A bonding layer having a high thermal conductivity and a high electrical conductivity generally has a large linear expansion coefficient (e.g., 17 to 25 ppm/K). Because of this, thermal stress occurs due to a difference between the linear expansion coefficient of a bonding layer and the linear expansion coefficient of silicon (Si) or silicon carbide (SiC) constituting a semiconductor chip or semiconductor device. Thermal cycle stress is thus likely to cause cracking or peeling. Especially, a semiconductor device using SiC as a semiconductor material is typically configured for high power output and likely to heat to high temperature, so that the above-noted tendency is more likely to be observed.

In consideration of this, highly reliable semiconductor devices are required for semiconductor devices using SiC or the like.

Advantage of the Present Disclosure

According to the present disclosures, a highly reliable, SiC-based semiconductor device is provided.

In the following, embodiments will be described by referring to the accompanying drawings.

Description of Embodiments of the Present Disclosure

Embodiments of the present disclosures will be listed and described first. In the following description, the same or corresponding elements are referred to by the same reference numerals, and a duplicate description thereof will be omitted.

[1] A semiconductor device according to an embodiment of the present disclosures includes a semiconductor chip made of material containing silicon carbide, a base plate including a plate-shaped insulating body and metal layers disposed on opposite faces thereof, and a bonding material bonding the semiconductor chip on one face of the base plate, wherein the bonding material is made of a metal material whose post-bonding melting point is greater than or equal to 773° C., wherein a thickness of the bonding material is less than or equal to 50 micrometers, wherein a thickness of the base plate is greater than or equal to 500 micrometers, and wherein with a thickness of the insulating body being denoted as $t_I$, and a thickness of each of the metal layers being denoted as $t_M$, a value of $t_I/t_M$ is greater than or equal to 4.3.

The present inventors have found that in a base plate bonded via a bonding material to a semiconductor chip made of material containing silicon carbide, the bonding strength becomes high, and reliability improves, when the bonding material is a metal material with a post-bonding melting point greater than or equal to 773° C., and has a thickness less than or equal to 50 micrometers, with the thickness of the base plate being greater than or equal to 500 micrometers, and when, with the thickness of the insulating body being denoted as $t_I$, and the thickness of each of the metal layers being denoted as $t_M$, a value of $t_I/t_M$ is greater than or equal to 4.3. With this arrangement, a highly reliable, SiC-based semiconductor device is provided. It may be noted that the method disclosed in Patent Document 1 needs to increase the thickness of a solder bonding layer in order to reduce large thermal stress. In such a case, however, heat dissipation through the solder bonding layer becomes unsatisfactory.

[2] The insulating body is made of material containing silicon nitride, and the metal layers are made of material containing copper.

[3] The value of $t_I/t_M$ is less than or equal to 18.

[4] The value of $t_I/t_M$ is less than or equal to 9.2.

[5] A semiconductor chip made of material containing silicon carbide, a base plate including an insulating body and metal layers disposed on opposite faces thereof, and a bonding material bonding the semiconductor chip on one face of the base plate are provided, wherein the bonding material is made of a metal material whose post-bonding melting point is greater than or equal to 773° C., wherein a thickness of the bonding material is less than or equal to 50 micrometers, wherein a thickness of the base plate is greater than or equal to 500 micrometers, and wherein a linear expansion coefficient of the base plate is greater than or equal to 2.9 ppm/K and less than or equal to 5.1 ppm/K.

[6] The thickness of the base plate is less than or equal to 2 mm.

[7] The base plate is a first base plate, the first base plate being bonded to one face of the semiconductor chip, and a second base plate is bonded to another face of the semiconductor chip via a bonding material, and wherein the second base plate has a same structure as the first base plate.

Details of Embodiments of the Present Disclosure

In the following, an embodiment (hereinafter referred to as a present embodiment) of the present disclosures will be described in detail, with a caveat that the present embodiment is not limited to those described.

First, the results of a simulation performed by the inventors with respect to an SiC-based semiconductor device will be described. The relationships between the film thickness of a bonding layer 30 and the deformation of the bonding layer 30 relative to a base plate 10 were evaluated with respect to a model, having a structure illustrated in FIG. 1, in which a semiconductor chip is bonded on the base plate 10 via the bonding layer 30. The semiconductor chip 20 is implemented as SiC with an area of 5 mm by 5 mm and a thickness of 0.2 mm to 0.3 mm. SiC has a linear expansion coefficient of 4 ppm/K and a Young's modulus of 440 GPa. The base plate 10 is configured to have an area of 50 mm by 50 mm and a thickness of 1.0 mm, and is assumed to have a linear expansion coefficient of 5 ppm/K and a Young's modulus of 240 Gpa. Copper (Cu) is used for the bonding layer 30, which has the same size as the semiconductor chip 20 for the purpose of bonding the semiconductor chip 20, and has a varying thickness. Cu has a linear expansion coefficient of 17 ppm/K and a Young's modulus of 130 GPa. In the present disclosures, the bonding layer 30 may sometimes be referred to as a bonding material.

Figure 2:
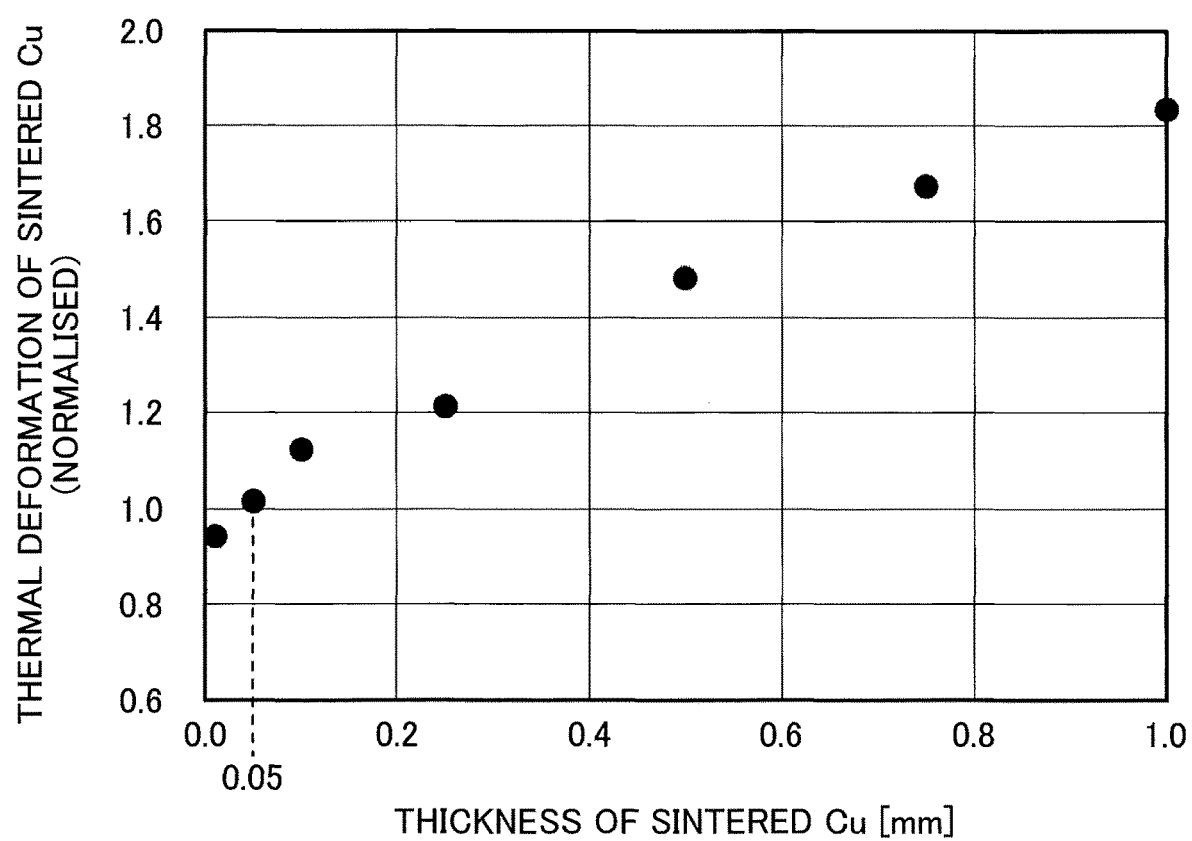
FIG. 2 is a correlation diagram between the thickness of a bonding layer and the amount of deformation of the bonding layer relative to the amount of deformation of a base plate.

FIG. 2 illustrates the results of a simulation that was conducted with respect to the model having the above-noted structure by changing temperature over a 175-° C. temperature range. The horizontal axis of FIG. 2 represents the thickness of sintered copper which is the thickness of the bonding layer 30. The vertical axis represents a value indicative of the amount of deformation of the bonding layer 30 relative to the amount of deformation of the base plate 10, i.e., (bonding-layer deformation amount)/(base-plate deformation amount). As is illustrated in FIG. 2, the value indicative of (bonding-layer-30 deformation amount)/(base-plate-10 deformation amount) is approximately 1 when the thickness of the bonding layer 30 is 0.05 mm (i.e., 50 micrometers). When the thickness of the bonding layer 30 is less than or equal to 0.05 mm, the bonding layer 30 deforms in approximate conformity to the deformation of the base plate 10.

The materials that constitute the bonding layer 30 include a sintered body of silver (Ag), a Cu—Sn alloy, Ni, or the like, in addition to a sintered body of Cu having a linear expansion coefficient of 17 ppm/K. The linear expansion coefficient of Ag is 19 ppm/K. The linear expansion coefficient of a Cu—Sn alloy is 21 ppm/K or more. The linear expansion coefficient of Ni is 12.8 ppm/K. Ni has a lower thermal conductivity and a higher resistance than Cu and Ag. Accordingly, Cu or Ag is preferable as a material to constitute the bonding layer 30. Moreover, since Cu has a lower linear expansion coefficient and is less expensive than Ag, Cu is more preferable from this point of view. It may be noted that the melting point of Ag is 961° C., and the melting point of Cu is 1083° C. For the purpose of achieving high bonding strength at the bonding layer 30, the higher the density of the bonding layer 30 is, the more preferable the bonding layer is. The density is preferably greater than or equal to 96%.

In the semiconductor device of the present embodiment, the semiconductor chip 20 is made of SiC. With this configuration, the condition in which the operating temperature ranges from −50° C. to 250° C. (i.e., the amount of a temperature change is 300° C.) will be assumed for the following analysis. A metal material is known to exhibit the phenomenon called creep deformation as the temperature increases, in which even a small amount of strain shortens the lifetime without creating elastic deformation. The effect of creep deformation starts to appear when the absolute temperature becomes approximately half the melting point. Accordingly, a material whose melting point is greater than or equal to 1046 K (i.e., 773° C.), i.e., twice an absolute temperature of 523 K corresponding to 250° C., may be used for the bonding layer 30 to suppress the effect of creep deformation and to confine deformation within the range of elastic deformation, thereby preventing the shortening of lifetime.

Figure 3:
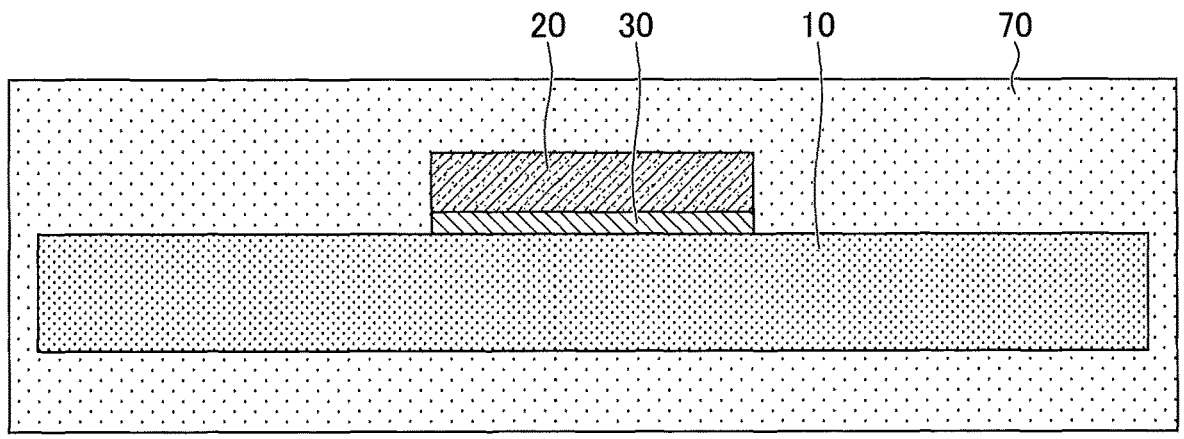
FIG. 3 is a model diagram of a semiconductor device used in temperature-rise-and-fall experiments.

Next, an experiment was conducted with respect to a plurality of samples having different materials as a material constituting the base plate 10. This experiment was conducted with respect to a sample which was placed in a silicone gel 70 as illustrated in FIG. 3 and in which the thickness of the base plate 10 was 3 mm, and the bonding layer 30 was made of sintered copper that was 50 micrometers in thickness. The base plate 10 is supposed to have a metal film or the like formed on the surface of an insulating substrate. For the sake of convenience, however, the base plate 10 made of a metal material was used. In this experiment, a sample 3A had the base plate 10 made of molybdenum (Mo). A sample 3B had the base plate 10 made of Cu-85Mo. A sample 3C had the base plate 10 made of Cu-60Mo.

The linear expansion coefficient of Mo is 5.1 ppm/K. The linear expansion coefficient of Cu-85Mo is 7.0 ppm/K. The linear expansion coefficient of Cu-60Mo is 8.4 ppm/K. With respect to the samples 3A, 3B, and 3C, the relationships between the bonding area of the bonding layer 30 and the number of temperature-rise-and-fall cycles were evaluated, wherein one cycle was comprised of 30 minutes at −40° C., a subsequent temperature rise to 200° C., 30 minutes at 200° C., and a subsequent temperature fall to −40° C. It may be noted that the bonding area of the bonding layer 30 was measured by using an SAT (i.e., scanning acoustic tomograph).

Figure 4:
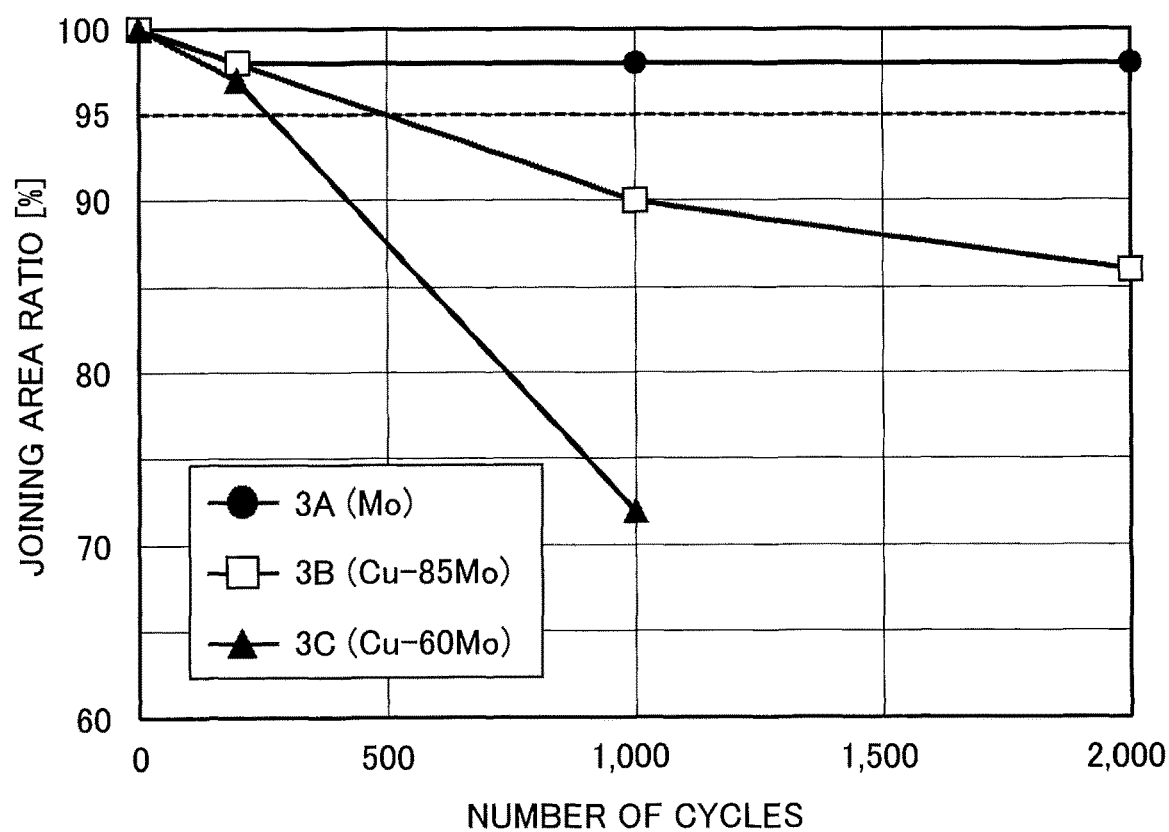
FIG. 4 is a correlation diagram between the number of temperature-rise-and-fall cycles and the bonding area of a bonding layer.

FIG. 4 illustrates the results. As illustrated in FIG. 4, the sample 3C having the base plate 10 made of Cu-60Mo had the bonding area of the bonding layer 30 becoming 72% of the original area upon the execution of 1000 temperature-rise-and-fall cycles. The measurement was thus terminated. The sample 3B having the base plate 10 made of Cu-85Mo had the bonding area of the bonding layer 30 becoming 90% of the original area upon the execution of 1000 temperature-rise-and-fall cycles, and had the bonding area of the bonding layer 30 becoming 86% upon the execution of 2000 cycles. In contrast, the sample 3A having the base plate 10 made of Mo had the bonding area of the bonding layer 30 becoming 98% of the original area upon the execution of 2000 temperature-rise-and-fall cycles. Namely, bonding reliability was high, with the bonding area of the bonding layer 30 being greater than or equal to 95%.

Figure 5:
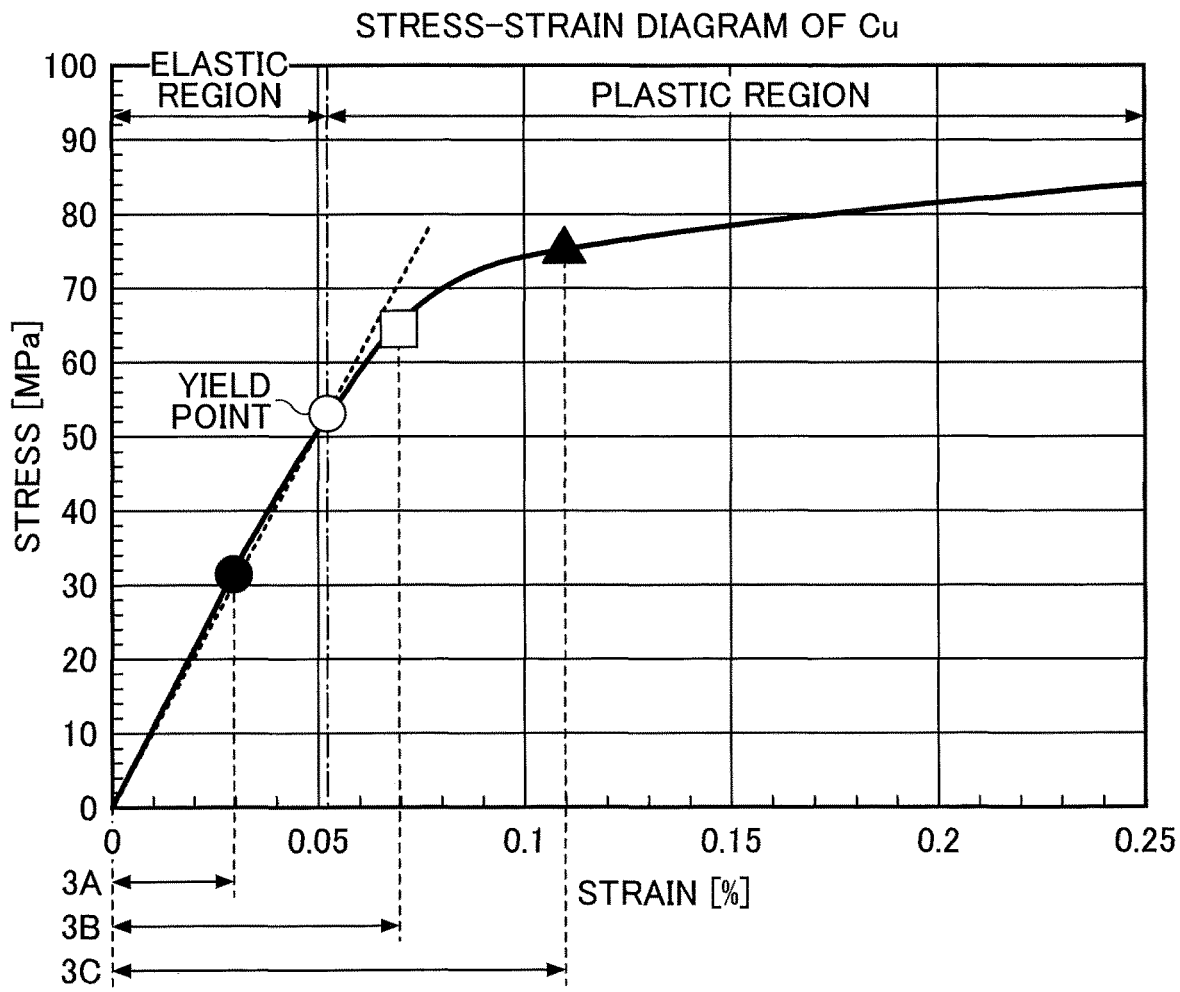
FIG. 5 is a correlation diagram between the strain and stress of Cu.

Then, the relationships between the results obtained in FIG. 4 and the strain and stress of Cu constituting the bonding layer 30 were analyzed. FIG. 5 is a drawing illustrating the relationships between the strain and stress of Cu. As observed from this figure, the yield point of Cu is approximately 0.052%. The strain of the base plate 10 relative to the semiconductor chip 20 in the case of a temperature rise and fall in a range of −40° C. to 200° C. is about 0.03% for the sample 3A, about 0.07% for the sample 3B, and 0.11% for the sample 3C.

Accordingly, deformation is in the range below the yield point for the sample 3A, and exceeds the yield point for the sample 3B and sample 3C. The following is thus inferred. In the case of the samples 3B and 3C, the bonding area significantly decreased due to repeated deformations exceeding the yield point of Cu resulting from temperature rises and falls. In the case of the sample 3A, however, there was almost no decrease in the bonding area despite temperature rises and falls because the deformation was confined within the range not exceeding the yield point of Cu. In the case of temperature changes in a range of −50° C. to 250° C., a temperature change is 300° C. The strain of the sample A in this case is approximately 0.033, so that deformation is confined within the range not exceeding the yield point of Cu. Namely, the difference between the linear expansion coefficient of the base plate 10 and the linear expansion coefficient of SiC of the semiconductor chip 20, multiplied by 300° C. is within the elastic range of the bonding material, so that deformation is within the elastic range of the bonding material. When deformation within the range of the yield point is taken into consideration, 6.0 ppm/K or lower is preferable.

It is believed that deformation within a range less than or equal to 60% of the yield point does not cause reduction in the bonding area even when temperature rises and falls generate a large number of repeated deformations. In consideration of this, the difference between the linear expansion coefficient of the base plate 10 and the linear expansion coefficient of SiC is preferably less than or equal to 1.1 ppm/K.

Accordingly, the linear expansion coefficient of the base plate 10 is preferably greater than or equal to the linear expansion coefficient of the semiconductor chip 20 minus 1.1 ppm/K and less than or equal to the linear expansion coefficient of the semiconductor chip 20 plus 1.1 ppm/K. In the case of the semiconductor chip 20 being SiC, the linear expansion coefficient of which is 4 ppm/K, the linear expansion coefficient of the base plate 10 is preferably greater than or equal to 2.9 ppm/K and less than or equal to 5.1 ppm/K.

Figure 6:
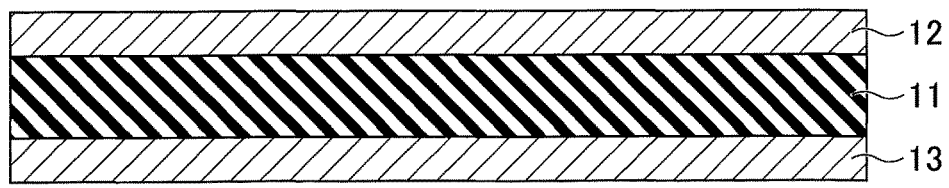
FIG. 6 is a structure diagram of a base plate used in a semiconductor device according to one aspect of the present disclosures.

The base plate 10 in actuality has metal layers 12 and 13 formed on the opposite faces of a plate-shaped insulating body 11 made of an insulating material as illustrated in FIG. 6. In order to set the linear expansion coefficient of such a base plate 10 within the range from 2.9 ppm/K inclusive to 5.1 ppm/K inclusive, the material and thickness of the insulating body 11 and the material and thickness of the metal layers 12 and 13 constituting the base plate 10 are considered to be important factors. A metal material that constitutes the metal layers 12 and 13 is generally required to have high electrical conductivity and the like, so that copper or a material including copper, for example, is preferable. Such a metal material having high electrical conductivity generally has a large linear expansion coefficient. Because of this, the insulating body 11 that constitutes the base plate is preferably made of a material having an insulating property and a low linear expansion coefficient. A material that constitutes the insulating body 11 may be aluminum nitride (AlN), aluminum oxide ($Al_2O_3$), silicon nitride ($Si_3N_4$), or the like. The linear expansion coefficient is 4.6 ppm/K for AlN, 7.2 ppm/K for $Al_2O_3$, and 2.7 ppm/K for $Si_3N_4$. Among these, $Si_3N_4$ has the lowest linear expansion coefficient, and is thus a preferable material for constituting the insulating body 11 of the base plate 10 according to the present embodiment.

In the following, analysis is conducted with respect to the base plate 10 having the structure illustrated in FIG. 6 to determine what relationship between the thickness of the insulating body 11 and the thickness of the metal layers 12 and 13 is required to set the linear expansion coefficient of the base plate 10 within the range from 2.9 ppm/K inclusive to 5.1 ppm/K inclusive. Specifically, a linear expansion coefficient $\alpha_{AMB}$ of the base plate is calculated and evaluated based on the following formula shown as formula 1.

$$\alpha_{AMB} = \frac{\alpha_{Cu} E_{Cu} V_{Cu} + \alpha_{SiN} E_{SiN} V_{SiN} + \alpha_{Cu} E_{Cu} V_{Cu}}{E_{Cu} V_{Cu} + E_{SiN} V_{SiN} + E_{Cu} V_{Cu}} \quad \text{Formula 1}$$

Figure 7:
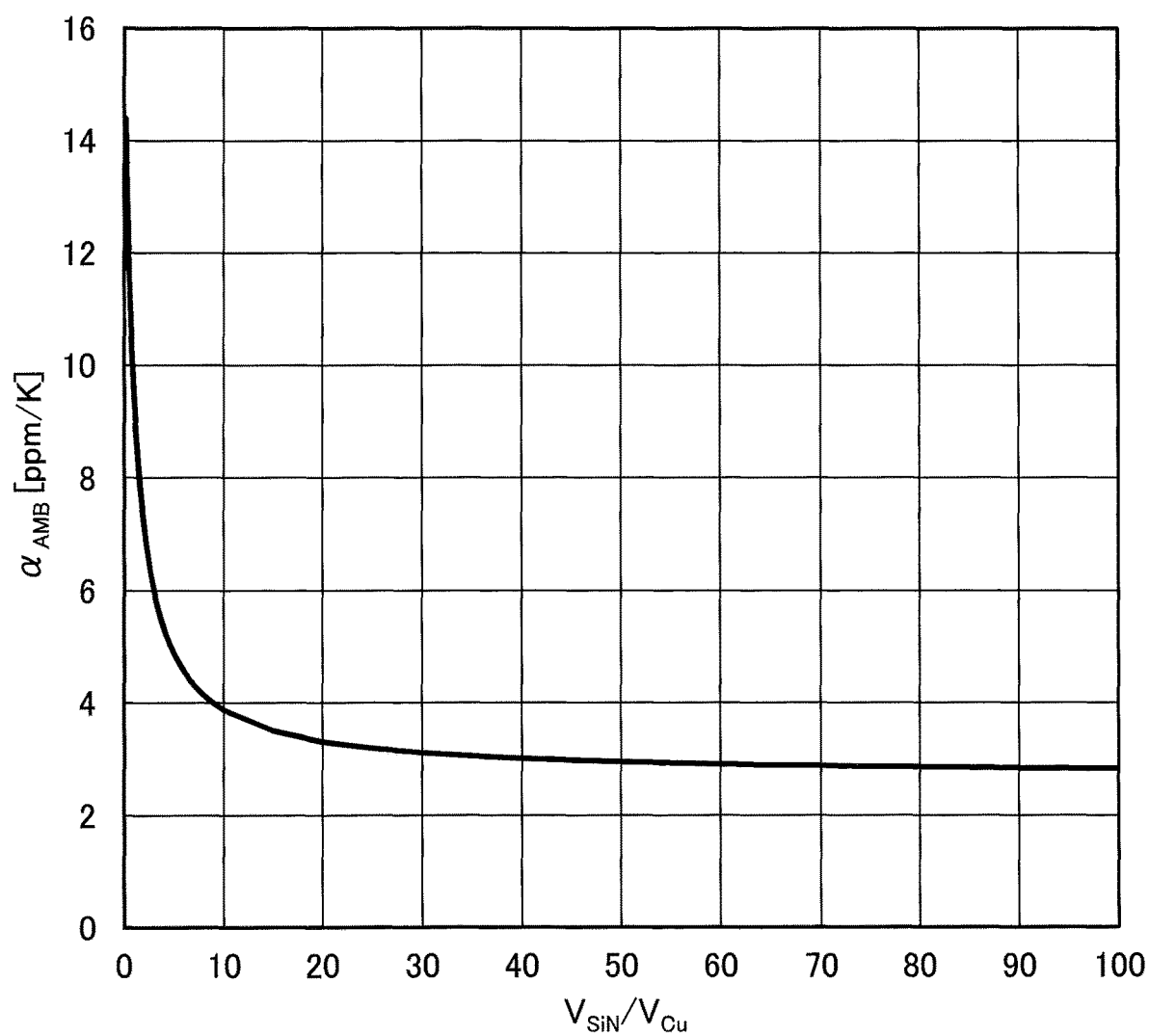
FIG. 7 is a correlation diagram (1) between a linear expansion coefficient and a volume ratio of a base plate to a metal layer.
Figure 8:
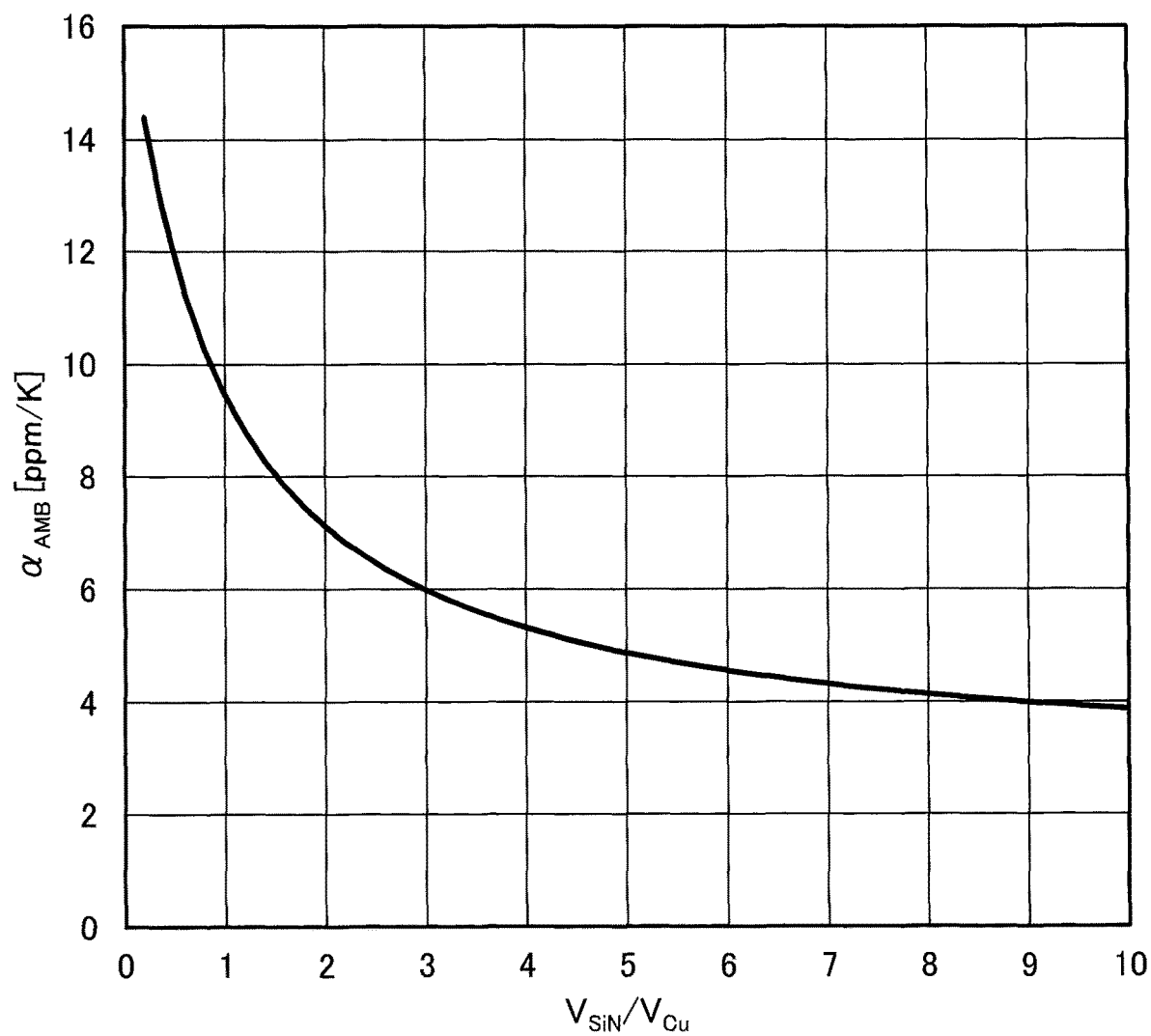
FIG. 8 is a correlation diagram (2) between a linear expansion coefficient and a volume ratio of a base plate to a metal layer.

The configuration is such that the insulating body 11 is made of $Si_3N_4$, and the metal layers 12 and 13 are made of copper. A linear expansion coefficient $\alpha_{Cu}$ of copper is 17 ppm/K, and a linear expansion coefficient $\alpha_{SiN}$ of $Si_3N_4$ is 2.7 ppm/K. A Young's modulus $E_{Cu}$ of copper is 130 Gpa, and a Young's modulus $E_{SiN}$ of $Si_3N_4$ is 290 Gpa. $V_{Cu}$ is the volume of copper with respect to each of one face and the other face. $V_{SiN}$ is the volume of $Si_3N_4$. The metal layers 12 and 13 are configured to have the same volume and formed on the opposite faces of the insulating body 11, so that the volume of copper of the base plate 10 is $2V_{Cu}$. Based on these values, the linear expansion coefficient $\alpha_{AMB}$ of the base plate 10 is calculated with respect to differing values of $V_{SiN}/V_{Cu}$. The results are illustrated in FIG. 7 and FIG. 8. FIG. 7 is a diagram covering the values of $V_{SiN}/V_{Cu}$ from 0 to 100, and FIG. 8 is a diagram covering the values of $V_{SiN}/V_{Cu}$ from 0 to 10.

As illustrated in FIG. 7, the linear expansion coefficient $\alpha_{AMB}$ of the base plate 10 becomes 5.1 ppm/K when the value of $V_{SiN}/V_{Cu}$ is 4.3, and the linear expansion coefficient $\alpha_{AMB\ m}$ of the base plate 10 becomes 2.9 ppm/K when the value of $V_{SiN}/V_{Cu}$ is 80. Accordingly, the value of $V_{SiN}/V_{Cu}$ with respect to the base plate 10 is preferably greater than or equal to 4.3 and less or equal to 80. It may be noted that the value of $V_{SiN}/V_{Cu}$ corresponds to the thickness ratio when the insulating body 11 and the metal layers 12 and 13 have the same area. As a result, a range of a thickness $t_I$ of the insulating body 11 relative to a thickness $t_M$ of the metal layers 12 and 13 with respect to base plate 10, i.e., a range of the value of $t_I/t_M$, is preferably greater than or equal to 4.3 and less or equal to 80.

Further, the heat dissipation property of the base plate 10 lowers as the insulating body 11 thickens, so that an excessive thickness is preferably avoided. It follows that the linear expansion coefficient $\alpha_{AMB}$ of the base plate 10 is preferably less than or equal to 5.1 ppm/K and greater than or equal to 4 ppm/K that is equal to the linear expansion coefficient of SiC. As illustrated in FIG. 8, the value of $V_{SiN}/V_{Cu}$ is 9.2 when the linear expansion coefficient $\alpha_{AMB}$ of the base plate 10 is 4 ppm/K. Accordingly, the value of $V_{SiN}/V_{Cu}$ with respect to the base plate 10 is preferably greater than or equal to 4.3 and less or equal to 9.2. As a result, a range of the thickness $t_I$ of the insulating body 11 relative to the thickness $t_M$ of the metal layers 12 and 13 with respect to base plate 10, i.e., a range of the value of $t_I/t_M$, is preferably greater than or equal to 4.3 and less or equal to 9.2.

In the present embodiment, the semiconductor chip 20 is bonded to the base plate 10 via the bonding layer 30. As illustrated in FIG. 2, it is preferable for the base plate 10 to have a sufficient thickness relative to the bonding layer 30 in order for the effect of the base plate 10 to be predominant. In the case of the thickness of the bonding layer 30 being 50 micrometers, the thickness of the base plate 10 is preferably greater than or equal to 500 micrometers.

As the base plate 10 becomes excessively thick, the semiconductor device becomes undesirably bulky, so that the thickness of the base plate 10 is preferably less than or equal to 2 mm. Further, in order to provide a sufficient electrical conductivity for the metal layers 12 and 13, the thickness of the metal layers 12 and 13 is required to be greater than or equal to 100 micrometers when the metal layers 12 and 13 are made of copper. In consideration of these factors, the thickness $t_I$ of the insulating body 11 of the base plate 10 is 1800 micrometers when the thickness of the base plate 10 is 2 mm (i.e., 2000 micrometers) and the thickness $t_M$ of the metal layers 12 and 13 is 100 micrometers. In this case, the thickness $t_I$ of the insulating body 11 relative to the thickness $t_M$ of the metal layers 12 and 13 with respect to the base plate 10, as represented by the value of $t_I/t_M$, is 18. Namely, $t_I/t_M$ is preferably less than or equal to 18.

Figure 9:
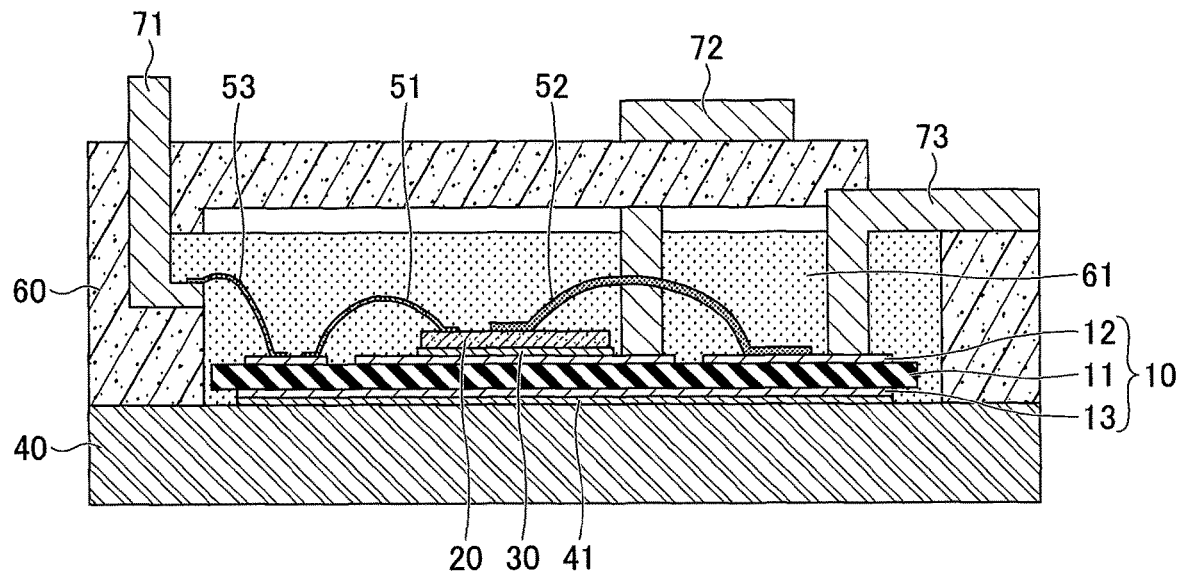
FIG. 9 is a diagram illustrating a semiconductor device power module according to one aspect of the present disclosures.

In the following, the results of experiments will be described in which temperature-rise-and-fall cycles were performed with respect to modules that were created as illustrated FIG. 9 and FIG. 10. FIG. 9 illustrates a semiconductor device power module according to the present embodiment. In this power module, the semiconductor chip 20 made of SiC is bonded to one face of the base plate 10 via the bonding layer 30, and a heatsink plate 40 is bonded to the other face of the base plate 10 via a heatsink bonding layer 41. Electrode terminals on the upper face of the semiconductor chip 20 are connected to electrode terminals formed as a metal layer of the base plate 10, or electrode terminals formed as the metal layer of the base plate 10 are connected to one another, through bonding wires 51, 52, and 53. In this power module, the base plate 10 on the heatsink plate 40 and the semiconductor chip 20 are covered with a resin case 60. The resin case 60 is provided with interconnects 71, 72, and 73 for external connections. An encapsulating material 61 is injected into the inner space of the resin case 60.

In a semiconductor device power module 9A of the present embodiment illustrated in FIG. 9, the bonding layer 30 is implemented as sintered copper having a thickness of 50 micrometers. The base plate includes the insulating body 11 having a thickness of 650 micrometers and made of $Si_3N_4$ and the metal layers 12 and 13 each having a thickness of 150 micrometers and made of Cu. The linear expansion coefficient of the base plate 10 is approximately 5.1 ppm/K. The heatsink plate 40 is made of AlSiC that is a metal composite material. The value of $V_{SiN}/V_{Cu}$ is 4.33, and the linear expansion coefficient is approximately 7.5 ppm/K. The heatsink bonding layer 41 is made of a Sn-5Sb solder material inclusive of Sn and antimony (Sb). The bonding wires 51, 52, and 53 are made of aluminum (Al). The resin case 60 is made of a resin material. The encapsulating material 61 is made of silicone gel.

Figure 10:
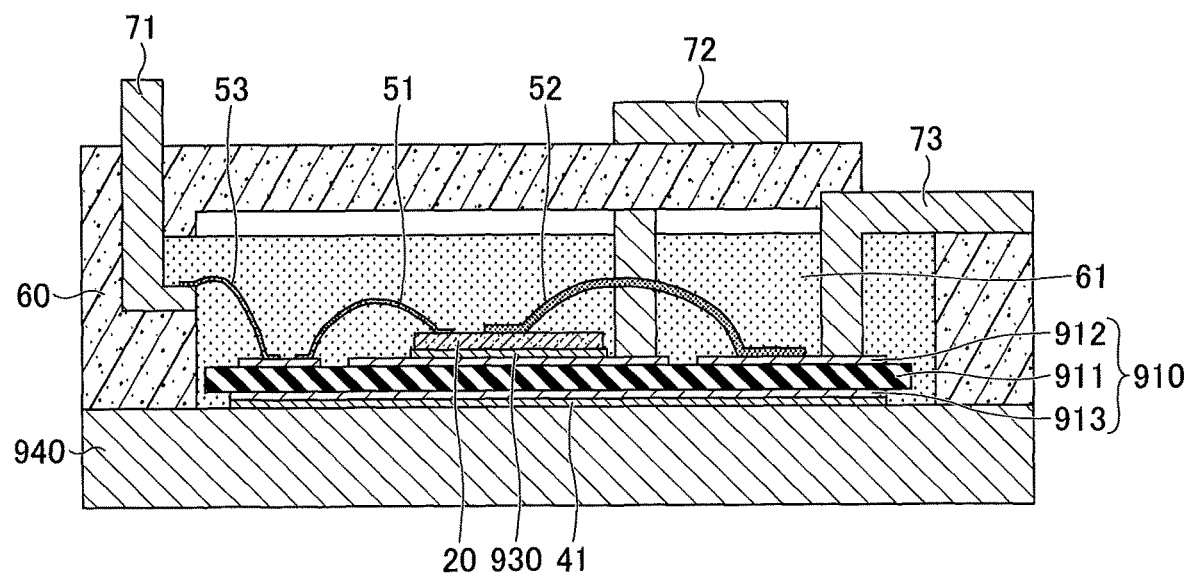
FIG. 10 is a diagram illustrating a semiconductor device power module used for comparison.

FIG. 10 illustrates a semiconductor device power module 10A used for comparison. In this power module, the semiconductor chip 20 made of SiC is bonded to one face of a base plate 910 via a bonding layer 930, and a heatsink plate 940 is bonded to the other face of the base plate 910 via a heatsink bonding layer 41. Electrode terminals on the upper face of the semiconductor chip 20 are connected to electrode terminals formed as a metal layer of the base plate 10, or electrode terminals formed as the metal layer of the base plate 10 are connected to one another, through bonding wires 51, 52, and 53. In this power module, the base plate 10 on the heatsink plate 40 and the semiconductor chip 20 are covered with a resin case 60. The resin case 60 is provided with interconnects 71, 72, and 73 for external connections. An encapsulating material 61 is injected into the inner space of the resin case 60.

In the semiconductor device power module illustrated in FIG. 10, the bonding layer 930 is implemented as Sn-10Sb having a thickness of 100 micrometers, the linear expansion coefficient of which is 21 ppm/K. The base plate 910 includes the insulating body 911 having a thickness of 320 micrometers and made of $Si_3N_4$ and the metal layers 912 and 913 each having a thickness of 300 micrometers and made of Cu. The value of $V_{SiN}/V_{Cu}$ is 1.07, and the linear expansion coefficient is 9 ppm/K. The heatsink plate 940 is made of Cu.

Figure 11:
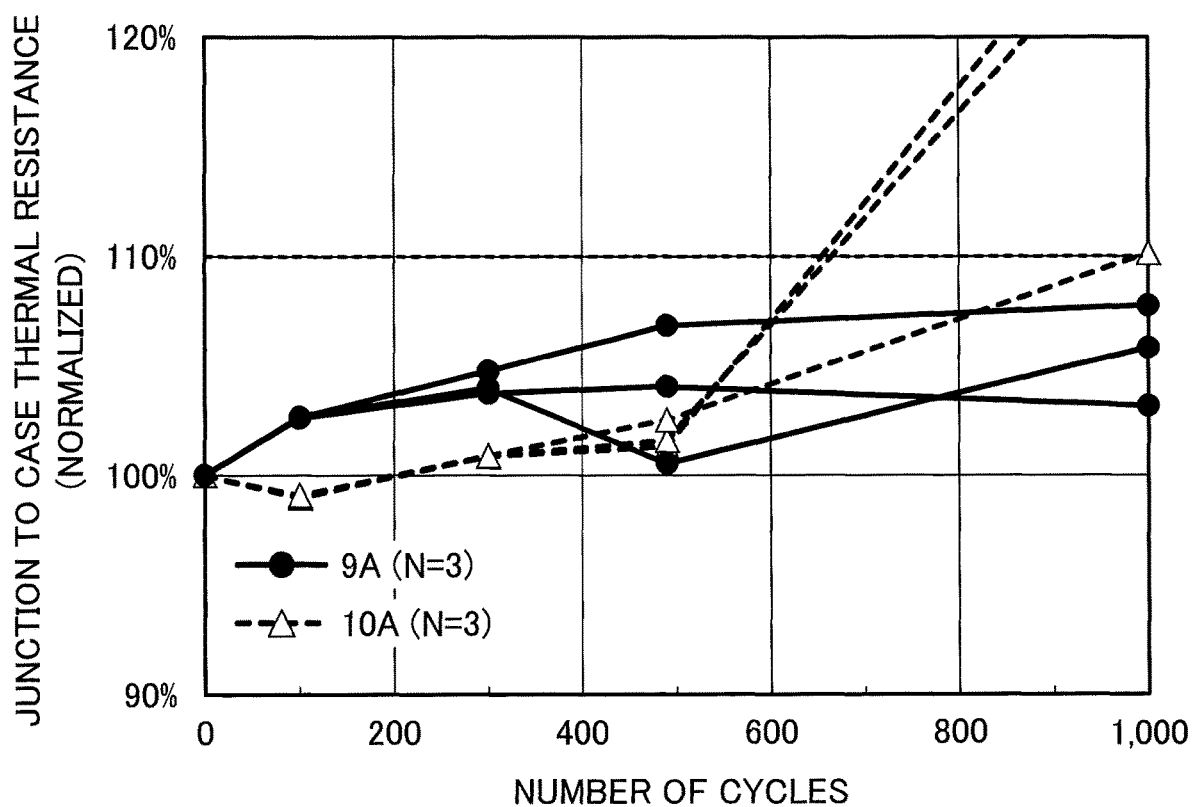
FIG. 11 is a correlation diagram between the number of temperature-rise-and-fall cycles and a change in thermal resistance.
Figure 12:
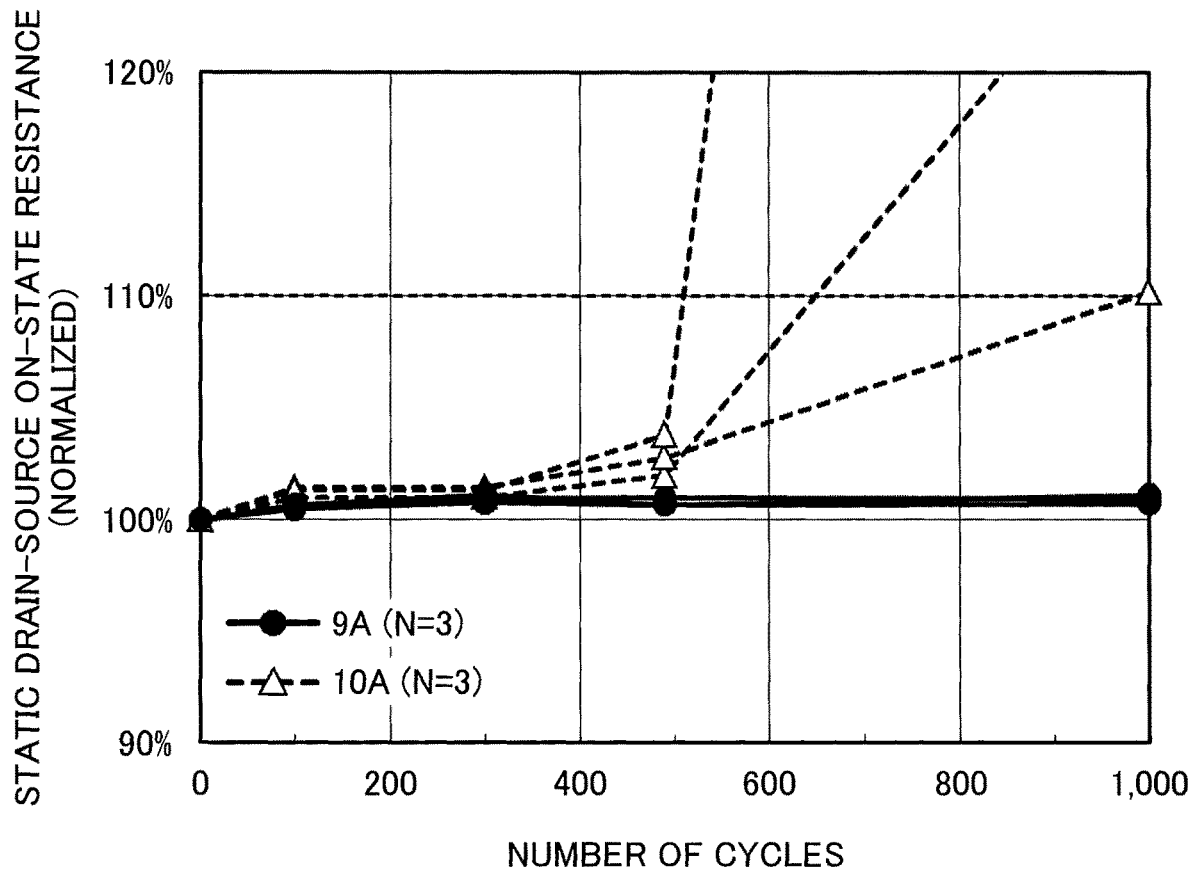
FIG. 12 is a correlation diagram between the number of temperature-rise-and-fall cycles and a change in on-resistance.

FIG. 11 and FIG. 12 illustrate the results of temperature-rise-and-fall experiments which were conducted with respect to the semiconductor device power module of the present embodiment illustrated in FIG. 9 and with respect to the semiconductor device power module for use in comparison as illustrated in FIG. 10. In connection with FIG. 11 and FIG. 12, three semiconductor device power modules 9A of the present embodiment and three semiconductor device power modules 10A for use in comparison were made and subjected to measurement. In FIG. 11 and FIG. 12, solid lines indicate the characteristics of the semiconductor device power modules 9A of the present embodiment, and dashed lines indicate the characteristics of the semiconductor device power modules 10A for use in comparison.

FIG. 11 illustrates detected changes in the thermal resistance of each power module. With an initial temperature being denoted as $T_1$ and a temperature upon the injection of consumed power P being denoted as $T_2$, a thermal resistance Rth was calculated as Rth=$(T_1-T_2)$/P, and a change in the thermal resistance value is plotted along the vertical axis. Up to approximately 500 temperature-rise-and-fall cycles, there are no significant changes with respect to either the semiconductor device power modules 9A of the present embodiment or the semiconductor device power modules 10A for use in comparison. As the number of temperature-rise-and-fall cycles exceeds 500 and reaches about 1000, a change in the thermal resistance rapidly increases for the semiconductor device power modules 10A for use in comparison. In contrast, there is no significant change for the semiconductor device power modules 9A of the present embodiment, with the amount of change being less than or equal to 10%.

FIG. 12 illustrates detected changes in the on-resistance of each power module. The amount of change in on-resistance relative to an initial on-resistance is plotted along the vertical axis. In the initial state, current flowing upon a voltage of 2V being applied was 100 A, and the initial on-resistance was 2 mQ. Up to approximately 500 temperature-rise-and-fall cycles, there are no significant changes with respect to either the semiconductor device power modules 9A of the present embodiment or the semiconductor device power modules 10A for use in comparison. As the number of temperature-rise-and-fall cycles exceeds 500 and reaches about 1000, a change in the on-resistance rapidly increases for the semiconductor device power modules 10A for use in comparison. In contrast, there is no significant change for the semiconductor device power modules 9A of the present embodiment, with the amount of change being less than or equal to 10%.

A reasonable inference can be made that the reason why the amount of change in thermal resistance and the amount of change in on-resistance rapidly increase for the semiconductor device power modules 10A for use in comparison as illustrated in FIG. 11 and FIG. 12 is because there is reduction in the bonding area of a bonding layer. In contrast, there is almost no reduction in the bonding area of a bonding layer with respect to the semiconductor device power modules 9A of the present embodiment, so that the amount of changes in thermal resistance and on-resistance does not change significantly.

Figure 13:
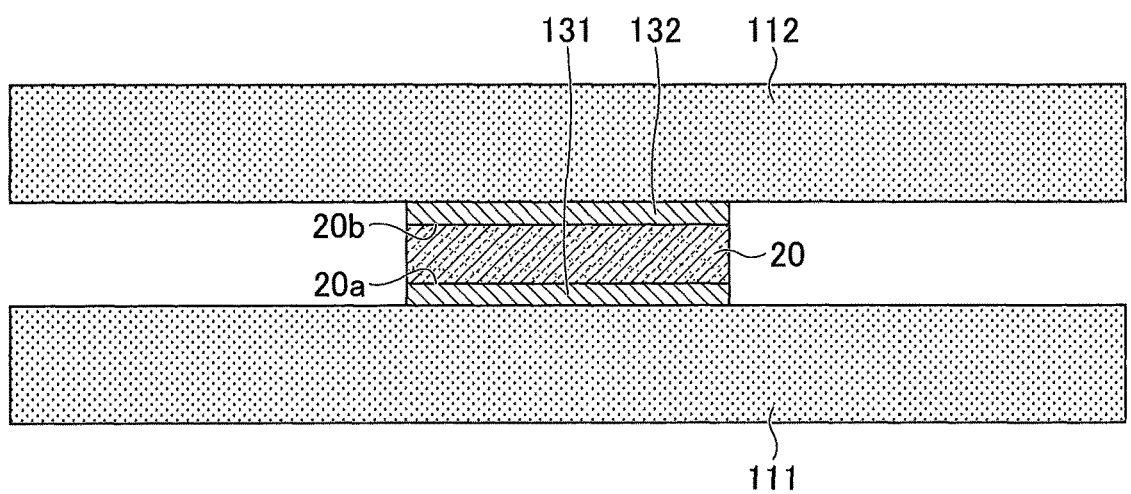
FIG. 13 is a diagram illustrating a semiconductor device according to another aspect of the present disclosures.

The present embodiment may employ a structure in which base plates are disposed on the opposite faces of a semiconductor chip. Specifically, the structure may be such that, as illustrated in FIG. 13, a first base plate 111 is bonded to one face 20a of the semiconductor chip 20 via a first bonding layer 131, and a second base plate 112 is bonded to another face 20b via a second bonding layer 132. It may be noted that the first base plate 111 and the second base plate 112 have the same structure as the base plate 10 illustrated in FIG. 6, in which the metal layers 12 and 13 are disposed on the opposite faces of the insulating body 11. Moreover, the first bonding layer 131 and the second bonding layer 132 are made of the same material as the bonding layer 30.

Although one or more embodiments have heretofore been described, any particular embodiments are non-limiting, and various variations and modifications may be made without departing from the scopes defined by the claims.

DESCRIPTION OF REFERENCE SYMBOLS 10 base plate
11 insulating body
12 metal layer
13 metal layer
20 semiconductor chip
30 bonding layer

The invention claimed is:

1. A semiconductor device, comprising:
a semiconductor chip made of material containing silicon carbide;
a base plate including a plate-shaped insulating body and metal layers disposed on opposite faces thereof; and
a bonding material bonding the semiconductor chip on one face of the base plate,
wherein the bonding material is made of a metal material whose post-bonding melting point is greater than or equal to 773° C.,
wherein a thickness of the bonding material is less than or equal to 50 micrometers,
wherein a thickness of the base plate is greater than or equal to 500 micrometers, and
wherein with a thickness of the insulating body being denoted as $t_I$, and a thickness of each of the metal layers being denoted as $t_M$, a value of $t_I/t_M$ is greater than or equal to 4.3.

2. The semiconductor device as claimed in claim 1, wherein the insulating body is made of material containing silicon nitride, and
the metal layers are made of material containing copper or silver.

3. The semiconductor device as claimed in claim 1, wherein the value of $t_I/t_M$ is less than or equal to 18.

4. The semiconductor device as claimed in claim 1, wherein the value of $t_I/t_M$ is less than or equal to 9.2.

5. A semiconductor device, comprising:
a semiconductor chip made of material containing silicon carbide;
a base plate including an insulating body and metal layers disposed on opposite faces thereof; and
a bonding material bonding the semiconductor chip on one face of the base plate,
wherein the bonding material is made of a metal material whose post-bonding melting point is greater than or equal to 773° C.,
wherein a thickness of the bonding material is less than or equal to 50 micrometers,
wherein a thickness of the base plate is greater than or equal to 500 micrometers, and
wherein a linear expansion coefficient of the base plate is greater than or equal to 2.9 ppm/K and less than or equal to 5.1 ppm/K.

6. The semiconductor device as claimed in claim 1, wherein the thickness of the base plate is less than or equal to 2 mm.

7. The semiconductor device as claimed in claim 1, wherein the base plate is a first base plate, the first base plate being bonded to one face of the semiconductor chip,
and a second base plate is bonded to another face of the semiconductor chip via a bonding material, and
wherein the second base plate has a same structure as the first base plate.

8. The semiconductor device as claimed in claim 2, wherein the value of $t_s/t_M$ is less than or equal to 18.

9. The semiconductor device as claimed in claim 2, wherein the value of $t_s/t_M$ is less than or equal to 9.2.

10. The semiconductor device as claimed in claim 2, wherein the thickness of the base plate is less than or equal to 2 mm.

11. The semiconductor device as claimed in claim 3, wherein the thickness of the base plate is less than or equal to 2 mm.

12. The semiconductor device as claimed in claim 4, wherein the thickness of the base plate is less than or equal to 2 mm.

13. The semiconductor device as claimed in claim 5, wherein the thickness of the base plate is less than or equal to 2 mm.

14. The semiconductor device as claimed in claim 2, wherein the base plate is a first base plate, the first base plate being bonded to one face of the semiconductor chip,
and a second base plate is bonded to another face of the semiconductor chip via a bonding material, and
wherein the second base plate has a same structure as the first base plate.

15. The semiconductor device as claimed in claim 3, wherein the base plate is a first base plate, the first base plate being bonded to one face of the semiconductor chip,
and a second base plate is bonded to another face of the semiconductor chip via a bonding material, and
wherein the second base plate has a same structure as the first base plate.

16. The semiconductor device as claimed in claim 4, wherein the base plate is a first base plate, the first base plate being bonded to one face of the semiconductor chip,
and a second base plate is bonded to another face of the semiconductor chip via a bonding material, and
wherein the second base plate has a same structure as the first base plate.

17. The semiconductor device as claimed in claim 5, wherein the base plate is a first base plate, the first base plate being bonded to one face of the semiconductor chip,
and a second base plate is bonded to another face of the semiconductor chip via a bonding material, and
wherein the second base plate has a same structure as the first base plate.

18. The semiconductor device as claimed in claim 6, wherein the base plate is a first base plate, the first base plate being bonded to one face of the semiconductor chip,
and a second base plate is bonded to another face of the semiconductor chip via a bonding material, and
wherein the second base plate has a same structure as the first base plate.

* * * * *